(12) United States Patent
Hou et al.

(10) Patent No.: US 12,490,381 B2
(45) Date of Patent: Dec. 2, 2025

(54) CIRCUIT BOARD ASSEMBLY

(71) Applicant: Tyco Electronics (Shanghai) Co. Ltd., Shanghai (CN)

(72) Inventors: Ping Hou, Dongguan (CN); Xinjie (David) Zhang, Kunshan (CN); Hengkang Wu, Dongguan (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 467 days.

(21) Appl. No.: 17/876,685

(22) Filed: Jul. 29, 2022

(65) Prior Publication Data

US 2023/0030311 A1 Feb. 2, 2023

(30) Foreign Application Priority Data

Jul. 29, 2021 (CN) .......................... 202121751240.7

(51) Int. Cl.
*H05K 1/18* (2006.01)
*H05K 1/11* (2006.01)

(52) U.S. Cl.
CPC ............. *H05K 1/181* (2013.01); *H05K 1/117* (2013.01); *H05K 1/18* (2013.01); *H05K 1/111* (2013.01); *H05K 2201/10242* (2013.01); *H05K 2201/10356* (2013.01); *H05K 2201/10371* (2013.01); *H05K 2201/10522* (2013.01)

(58) Field of Classification Search
CPC ......... H05K 1/181; H05K 2201/10242; H05K 2201/10356; H05K 2201/10371; H05K 2201/10522; H05K 3/3415; H05K 2201/10189
See application file for complete search history.

(56) References Cited

U.S. PATENT DOCUMENTS

| | | | | |
|---|---|---|---|---|
| 2009/0120682 | A1* | 5/2009 | Ohtsuji | H01R 13/6658 174/359 |
| 2019/0052032 | A1* | 2/2019 | Wu | H05K 1/111 |
| 2019/0252834 | A1* | 8/2019 | Wu | H01R 13/665 |
| 2020/0119496 | A1* | 4/2020 | Zhang | H01R 13/6658 |
| 2020/0301084 | A1* | 9/2020 | Champion | G02B 6/428 |
| 2020/0366025 | A1* | 11/2020 | Hsiao | H01R 13/504 |

\* cited by examiner

*Primary Examiner* — Ishwarbhai B Patel
(74) *Attorney, Agent, or Firm* — Barley Snyder

(57) ABSTRACT

A circuit board assembly includes a circuit board, a plurality of cables soldered to a side of the circuit board, a protective member covering a plurality of solder joints of the cables on the circuit board, and a retainer provided on the side of the circuit board. The retainer fixes the protective member on the circuit board.

16 Claims, 2 Drawing Sheets

CIRCUIT BOARD ASSEMBLY

CROSS-REFERENCE TO RELATED APPLICATIONS

This application claims the benefit of the filing date under 35 U.S.C. § 119(a)-(d) of Chinese Patent Application No. 202121751240.7, filed on Jul. 29, 2021.

FIELD OF THE INVENTION

The present application relates to a circuit board assembly, in particular to a circuit board assembly with optimized space arrangement.

BACKGROUND

When cables are soldered on a circuit board to electrically connect electronic components on the circuit board to a power source, a protective member is often injection molded on the circuit board to protect solder joints between the cables and the electronic components. A part of the protective member is formed on a side of the circuit board where the solder joints are located to protect the solder joints, and the other part of the protective member is formed on an opposite side of the circuit board where adhesive is provided thereon to fix the protective member to the circuit board, otherwise the protective member would detach from the circuit board and thus fail to protect the solder joints.

The use of the adhesive, however, results in a constraint or limitation on space for the electronic components being arranged therein, on the opposite side of the circuit board, making it difficult to fully utilize the space on the circuit board to arrange more electronic components. This not only limits functionality of the circuit board assembly, but also increases manufacturing cost of the circuit board assembly.

SUMMARY

A circuit board assembly includes a circuit board, a plurality of cables soldered to a side of the circuit board, a protective member covering a plurality of solder joints of the cables on the circuit board, and a retainer provided on the side of the circuit board. The retainer fixes the protective member on the circuit board.

BRIEF DESCRIPTION OF THE DRAWINGS

The invention will now be described by way of example with reference to the accompanying Figures, of which.

DETAILED DESCRIPTION OF THE EMBODIMENTS

Figure 1:
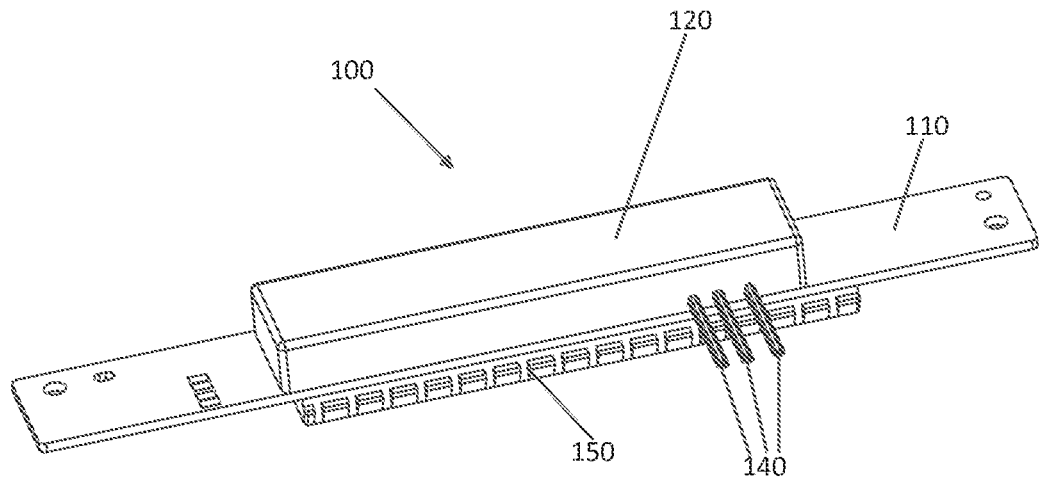
FIG. 1 is a perspective view of a circuit board assembly according to an embodiment.

The technical solutions of the present application will be further described below through embodiments and in conjunction with the drawings. In the specification, the same or similar reference numerals indicate the same or similar components. The following description of the embodiments of the present application with reference to the accompanying drawings is intended to explain the general inventive concept of the present application, and should not be construed as a limitation to the present application.

In addition, in the following detailed description, for the convenience of explanation, many specific details are set forth to provide a comprehensive understanding of the embodiments of the present disclosure. However, obviously, one or more embodiments can also be implemented without these specific details. In other cases, well-known structures and devices are embodied in an illustrative manner to simplify the drawings.

Figure 2:
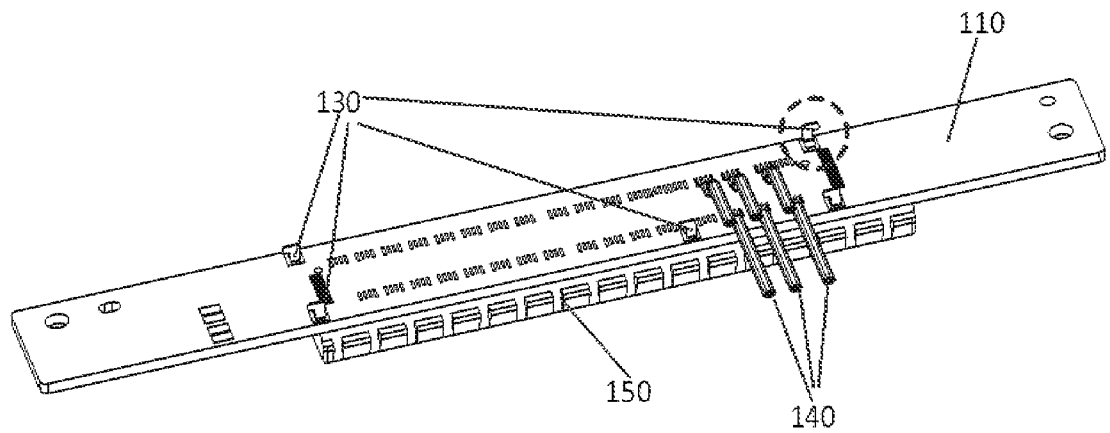
FIG. 2 is a perspective view of the circuit board assembly of FIG. 1 with a protective member removed to show retainers.

FIG. 1 shows a circuit board assembly 100, and FIG. 2 is a perspective view of the circuit board assembly 100 of FIG. 1 showing retainers 130 with a protective member 120 being removed.

The circuit board assembly 100 comprises a circuit board 110, a protective member 120, and a retainer 130. Cables 140 are soldered to the circuit board 110 on a side of the circuit board 110 so as to connect electronic components disposed on an opposite side of the circuit board 110 to a power source. The protective member 120 may be a housing, formed on the side of the circuit board 110 by injection molding. The protective member 120 covers and dads solder joints of the cables 140 on the circuit board 110 so as to protect the solder joints and to prevent the solder joints from being loose due to force or short circuiting due to moisture, causing the circuit board assembly 100 to fail to operate properly.

The retainers 130 are provided on the side of the circuit board 110 so as to fix the protective member 120 on the circuit board 110. Provision of the retainers 130 eliminates any necessity of using adhesive on an opposite side of the circuit board 110, thus it is not required to form the protective member 120 partially on the opposite side of the circuit board 110. Therefore, more space is released on the opposite side of the circuit board 110, for arranging electronic components, and a spatial arrangement of the circuit board assembly 100 is optimized, which not only helps to improve function of the circuit board assembly 100, but also helps to reduce cost of the circuit board assembly 100.

The retainer 130 is a metal member, which is fixed to the side of the circuit board 110 by, for example, soldering, gluing, or plugging, etc., before the protective member 120 is injection-molded on the circuit board 110. The protective member 120 is formed by injection molding so as to cover and clad the retainers 130. Referring to FIG. 2, five retainers 130 are arranged on the side of the circuit board 110 in a circumferential direction of the protective member 120, wherein two retainers 130 are arranged at an edge of the circuit board 110, and three retainers 130 are arranged at an opposite edge of the circuit board 110. In the shown embodiment, one of the five retainers 130 is oriented opposite to the remaining four retainers 130, as described below. However, it should be understood by those skilled in the art that the number, orientation and arrangement of the retainers 130 (i.e., relative positions of the retainers 130 with respect to one another and positions of the retainers 130 on the side of the circuit board 110) are not limited by the embodiment in FIG. 2 as long as the protective member 120 is securely retained on the side of the circuit board 110.

Figure 3:
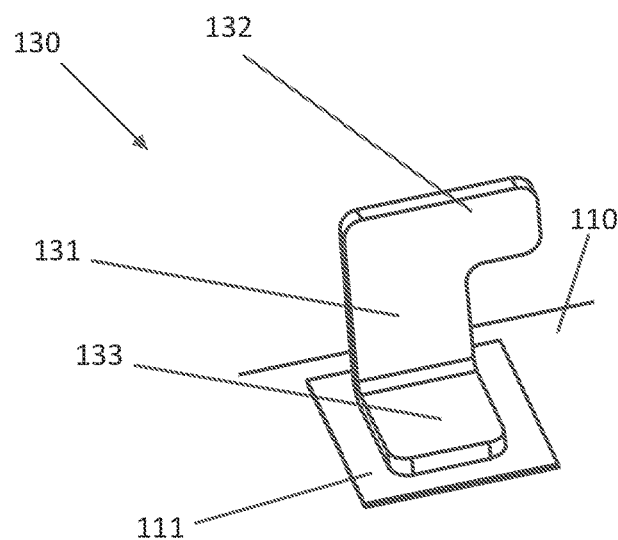
FIG. 3 is a detail perspective view of one of the retainers in a dashed circle of FIG. 2.

FIG. 3 shows a structure of the retainer 130 in detail. The retainer 130 is shaped as a "L" shape and comprises a first leg 131 and a second leg 132. The first leg 131 is fixed to the side of the circuit board 110 in a vertical direction (for example, by suitable element such as soldering, gluing or plugging-in, etc.), and the second leg 132 extends horizontally from the first leg 131 so as to fix the protective member 120 on the one side of the circuit board 110. The retainer 130 optionally comprises a base 133, which extends horizontally from the first leg 131 so as to be fixed to a fixing plate 111 on the side of the circuit board 110 by suitable elements such as soldering or gluing and the like.

FIG. 3 shows only one embodiment of the retainer 130, however, the retainer 130 may also be shaped into other structures capable of fixing the protective member 120 on the side of the circuit board 110, for example, the retainer 130 is entirely formed as a cylindrical pin or an arcuate hook, so as to form an interference fit with a respective one of holes in the protective member 120 to fix the protective member 120 on the circuit board 110.

Referring back to FIG. 2, a direction in which a second leg 132 of one of the retainers 130 extends is opposite to a direction in which a second leg 132 of each of the other retainers 130 extends. However, those skilled in the art should understand that this is not limitative, and relative orientations between respective second legs 132 may be arranged according to actual needs.

Figure 4:
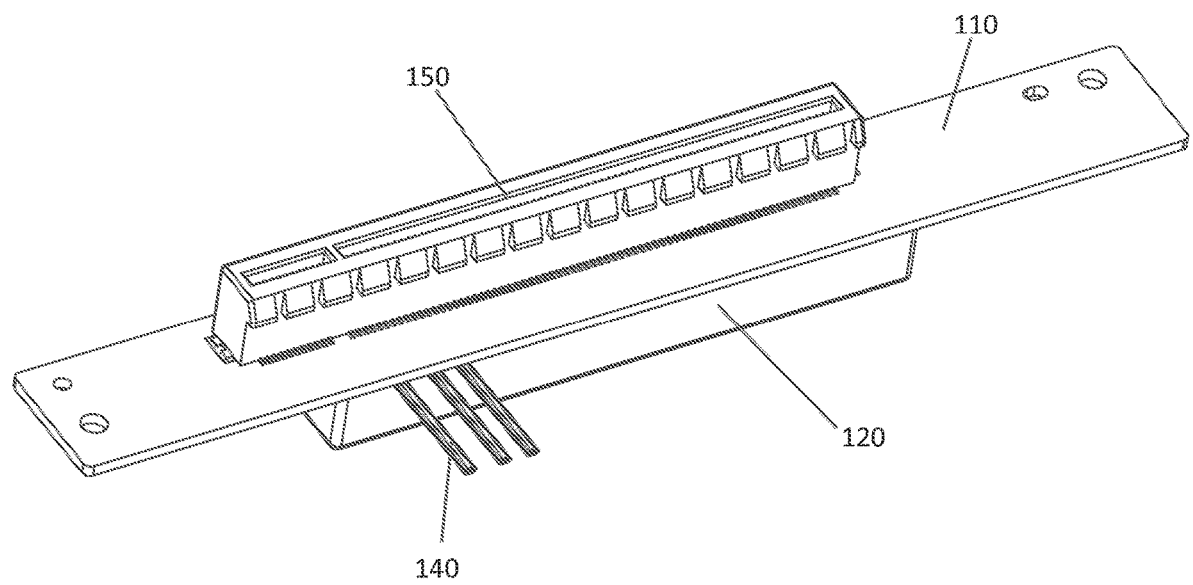
FIG. 4 is another perspective view of the circuit board assembly of FIG. 1.

FIG. 4 shows an opposite side of the circuit board assembly 100 to the side shown in FIG. 1 (i.e., the side opposite to the side of the circuit board assembly 100 in FIG. 1). The circuit board assembly 100 further comprises a connector 150 for electrical connection with other modules, circuits, etc., which is located on the opposite side of the circuit board 110, electrically connected to and thereby powered by the cables 140.

Those skilled in the art can understand that the embodiments described above are all exemplary, and those skilled in the art can improve them, and the structures described in the various embodiments can be combined freely without conflicting in terms of structure or principle.

After describing the embodiments of the present application in detail, those skilled in the art can clearly understand that various changes and modifications can be made without departing from the scope and spirit of the appended claims, and the present application is not limited to the implementations of the exemplary embodiments cited in the specification.

What is claimed is:

1. A circuit board assembly, comprising:
a circuit board;
a plurality of cables soldered to a side of the circuit board;
a protective member covering a plurality of solder joints of the cables on the circuit board; and
a retainer having an L-shape, the L-shape has a first leg fixed to a surface of the circuit board and extending perpendicular from the surface of the circuit board in a vertical direction and a second leg extending from the first leg in a horizonal direction, the second leg fixing the protective member on the surface of the circuit board.

2. The circuit board assembly of claim 1, wherein the retainer is one of a plurality of retainers arranged on the side of the circuit board.

3. The circuit board assembly of claim 2, wherein the retainers are arranged in a circumferential direction of the protective member.

4. The circuit board assembly of claim 2, wherein the second leg of one of the retainers extends in an opposite direction to the second leg of another one of the retainers.

5. The circuit board assembly of claim 2, wherein each of the retainers has a base extending horizontally from the first leg and secured to the surface of the circuit board.

6. The circuit board assembly of claim 2, wherein each of the retainers is a metal member.

7. The circuit board assembly of claim 6, wherein each of the retainers is soldered, glued or plugged into the side of the circuit board.

8. The circuit board assembly of claim 1, further comprising a connector on an opposite side of the circuit board from the cables.

9. The circuit board assembly of claim 8, wherein the connector is electrically connected to the cables.

10. The circuit board assembly of claim 1, wherein the protective member is formed on the side of the circuit board by injection molding.

11. The circuit board assembly of claim 10, wherein the protective member covers and clads the retainer.

12. The circuit board assembly of claim 10, wherein the protective member is formed around the retainer and abuts the surface of the circuit board.

13. The circuit board assembly of claim 1, wherein the protective member is only fixed on the circuit board by the retainer.

14. The circuit board assembly of claim 1, wherein the protective member is formed of an insulative material and abuts the solder joints of the cables on the circuit board.

15. A circuit board assembly, comprising:
a circuit board;
a plurality of cables soldered to a side of the circuit board;
a protective member covering a plurality of solder joints of the cables on the circuit board, the protective member is formed of an insulative material; and
a retainer provided on the side of the circuit board and fixing the protective member on the circuit board, the protective member abuts the side of the circuit board and the solder joints.

16. The circuit board assembly of claim 15, wherein the protective member is only provided on the side of the circuit board.

* * * * *